United States Patent [19]

Maeda et al.

[11] Patent Number: 4,572,888

[45] Date of Patent: Feb. 25, 1986

[54] PHOTOPOLYMERIZABLE COMPOSITION WITH ADHESION IMPROVING ADDITIVE

[75] Inventors: Minoru Maeda; Masayuki Iwasaki; Fumiaki Shinozaki, all of Shizuoka, Japan

[73] Assignee: Fuji Photo Film Co., Ltd., Kanagawa, Japan

[21] Appl. No.: 563,484

[22] Filed: Dec. 20, 1983

[30] Foreign Application Priority Data

Dec. 20, 1982 [JP] Japan .................................. 57-223277
Mar. 10, 1983 [JP] Japan .................................. 58-39399

[51] Int. Cl.[4] ................................................ G03C 1/74
[52] U.S. Cl. .................................... 430/288; 430/275; 430/281; 522/72; 522/78
[58] Field of Search ............... 430/281, 288, 919, 921, 430/275, 227; 204/159.18, 159.24

[56] References Cited

U.S. PATENT DOCUMENTS 3,429,795  2/1969  Delzenne et al. .................... 430/921
4,264,710  4/1981  Kondoh et al. ...................... 430/281
4,346,162  8/1982  Abele ................................. 430/919

*Primary Examiner*—Jack P. Brammer
*Attorney, Agent, or Firm*—Sughrue, Mion, Zinn, Macpeak, and Seas

[57] ABSTRACT

A photopolymerizable composition which comprises as main ingredients (1) a non-gaseous ethylenic unsaturated compound which has at least two ethylenic unsaturated groups and forms a polymer by the aid of a photopolymerization initiator, (2) a thermoplastic organic polymer binder, (3) a photopolymerization initiator which is activated by activating light, and (4) a derivative of a thiohydrazide compound or at least one derivative of a carbothio acid amide. This composition forms a photoresist for producing printed circuit boards, printing plates, etc., by etching or plating. The photoresist has superior adhesion with respect to the base.

5 Claims, No Drawings

PHOTOPOLYMERIZABLE COMPOSITION WITH ADHESION IMPROVING ADDITIVE

FIELD OF THE INVENTION

The present invention relates to a photopolymerizable composition which polymerizes and cures upon irradiation with activating light and which is improved in adhesion to the surfaces of metals, especially copper. More particularly, it relates to a photopolymerizable composition which easily cures upon exposure to light and forms a photoresist to be treated in an aqueous solution for plating and etching.

BACKGROUND OF THE INVENTION

Printed circuit boards are produced using photoresists. According to the dry film photoresist system disclosed in Japanese Patent Publication No. 25231/70, a photoresist in the form of film is laminated onto a copper-clad laminate (base), the photoresist is exposed to the activating light through a mask having the wiring pattern, and the unexposed parts are dissolved using an adequate developing solution, whereby a cured image is obtained on the base. The image is used as the resist and the copper not covered by the resist is etched, plated, or anodized. Thus, there is obtained a printed circuit board.

The dry film photoresist is not desirable because its adhesion to a metal surface is weaker than that of the solution type photoresist. This weak adhesion causes an unfavorable phenomenon during etching or plating. For example, when the base is sprayed with an etching solution or dipped in a plating solution, the solution infiltrates into the interface between the resist and the base, causing the resist to separate from the base. This leads to underetching or underplating, which, in turn, causes the image to become blurred or to disappear. If the adhesion problem is substantial, the desired pattern is not obtained and the base is wasted.

In the production of printed circuit boards by the use of a dry film resist, the resist pattern is closely attached to the base over the entire surface in some cases. In other cases where the base has through-holes, the resist pattern is not attached over the entire surface. (The through-holes are holes made through the base, with the inside surface thereof coated with a metal layer such as a copper layer, and they electrically connect the printed circuits formed on both sides of the base.) In such cases, it is necessary to stretch the resist film over the opening of the hole, so that the metal layer on the inside of the hole is protected from etching. The resist film thus formed sticks to the base at a very small area around the opening of the hole, and the film covering the opening of the hole is not supported. Yet, the resist film is required to have sufficient peel resistance against the etching spray.

In order to improve the peel resistance, pretreatment of the metal surface was proposed. (Japanese Patent Publication No. 5292/79 (U.S. Pat. No. 3,873,316) and Japanese Patent Laid-Open Nos. 64919/76 and 64920/76 (U.S. Pat. No. 4,233,395))

Several other methods for improving the adhesion by adding a variety of compounds to the photosensitive resin layer were also proposed. (Japanese Patent Publication Nos. 9177/75 (U.S. Pat. No. 3,622,334), 5292/79 (U.S. Pat. No. 3,873,316), 22481/80, 46053/82, 46054/82, 21697/82 and 40500/82, and Japanese Patent Laid-Open Nos. 64919/76, 64920/76, 63087/75, 2724/77, 702/78, 124541/78, 124594/78, 133585/79, 133586/79, 65947/80, 11904/81, 75642/81, 67844/81, 99202/81, 100803/81, 60327/82 and 62047/82)

The surface treatment in the former method requires an additional step. Therefore, the latter method is superior in this respect; but it is not desirable because the copper surface which is exposed after development turns red, and this discoloration adversely affects the subsequent etching, plating, or soldering. Moreover, some additives interfere with the photopolymerization reaction and have low miscibility with the photopolymerizable resin composition.

SUMMARY OF THE INVENTION

Accordingly, it is an object of this invention to provide a photopolymerizable composition which is free of the above-mentioned disadvantages and is improved in adhesion to the metal surface. More particularly, it is an object of this invention to provide a photopolymerizable composition for forming a dry film resist for the production of printed circuit boards.

The present inventors found that a photopolymerizable composition is improved in adhesion with respect to a metal surface when it is incorporated with a derivative of a thiohydrazide compound or a derivative of a carbothio acid amide.

The objects of this invention can be achieved by a photopolymerizable composition which comprises as main ingredients (1) a non-gaseous ethylenic unsaturated compound which has at least two ethylenic unsaturated groups and forms a polymer by the aid of a photopolymerization initiator, (2) a thermoplastic organic polymer binder, (3) a photopolymerization initiator which is activated by activating light, and (4) at least one derivative of a thiohydrazide compound as represented by formula (I) or at least one derivative of a carbothio acid amide as represented by formula (II) or formula (III).

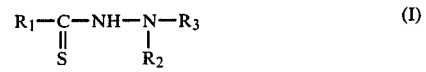

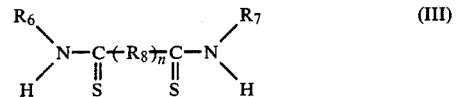

In these formulae, $R_1$, $R_2$ and $R_3$ each represents a hydrogen atom, an alkyl group having preferably up to 12 carbon atoms which may be substituted with, for example, $-OR_9$ group ($R_9$ represents a hydrogen atom, an alkyl group having up to 4 carbon atoms or an aryl group having 6 to 12 carbon atoms, hereinafter the same), $-NR_9R_{10}$ group ($R_{10}$ represents the same definition as $R_9$ and they may be the same or different from each other) or $-OOCR_{11}$ group ($R_{11}$ represents an alkyl group having up to 4 carbon atoms or an aryl group having 6 to 12 carbon atoms), an aryl group which may be substituted with, for example, an alkyl group having up to 4 carbon atoms, an aryl group having 6 to 12 carbon atoms, $-OR_9$ group or $-NR_9R_{10}$ group, a heterocyclic group which may be substituted with, for example, an alkyl group having up to 4 carbon atoms, an aryl group having 6 to 12 carbon atoms, —$OR_9$ group or —$NR_9R_{10}$ group, an acyl group having preferably up to 6 carbon atoms or an aralkyl group having an alkyl group containing up to 4 carbon atoms. They may be the same or different from one another and they may form a ring, for example, a heterocyclic ring such as thioketodihydropyridazine ring, thioketotetrahydropyridazine ring and piperidine ring.

$R_4$ and $R_5$ each represents a hydrogen atom, an alkyl group, an aryl group, a heterocyclic group or an aralkyl group all of which have the same carbon numbers and/or the same substituents as $R_1$, $R_2$ and $R_3$ described above. They may be the same or different from each other.

$R_6$ and $R_7$ each represents the same groups as defined for $R_4$ and $R_5$, $R_8$ represents an alkylene group having preferably up to 6 carbon atoms an arylene group or a heteroarylene group; and n represents 0 or 1.

As examples of the aryl group for $R_1$ to $R_7$, there are a phenyl group and a naphthyl group. As examples of the heterocyclic group for $R_1$ to $R_7$, there are a pyridine group, a thiazole group, an oxazole group, a triazole group, a benzothiazole group and a benzoxazole group. As examples of the aralkyl group for $R_1$ to $R_7$, there are a phenethyl group and a phenylpropyl group.

Examples of the $R_8$ arylene group include a phenylene group and a naphthylene group.

DETAILED DESCRIPTION OF THE INVENTION

The thiohydrazide derivative or carbothio acid amide derivative used in this invention improves adhesion with respect to metal surfaces without sacrificing the sensitivity for photopolymerization. It is in this respect that the derivative of this invention is different from conventional similar compounds such as tetramethylthiuram disulfide disclosed in Japanese Patent Publication No. 5292/79 (U.S. Pat. No. 3,873,316) and diphenylcarbazone derivative disclosed in Japanese Patent Publication No. 40500/82. These conventional compounds decrease the sensitivity and impede the photopolymerization when added in an amount sufficient to improve the adhesion with respect to the metal surface.

In addition, the photopolymerizable composition of this invention has no side effects which turn the copper surface red or discolor the dye and has good solubility.

The examples of the thiohydrazide derivatives used in this invention are represented by the following formulae 1 to 18, and the examples of the carbothio acid amide derivatives used in this invention are represented by the following formulae 19 to 43. The present invention is not limited to them.

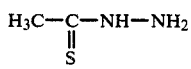

1.

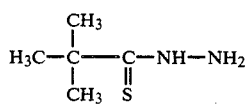

2.

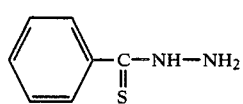

3.

-continued

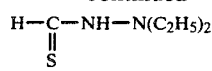

4.

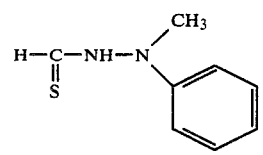

5.

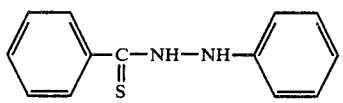

6.

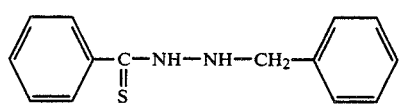

7.

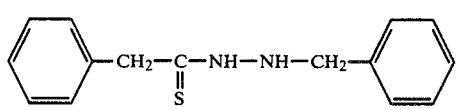

8.

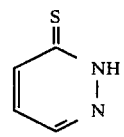

9.

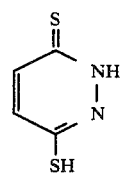

10.

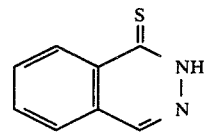

11.

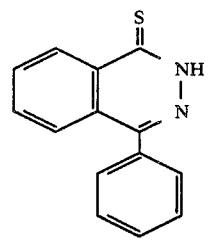

12.

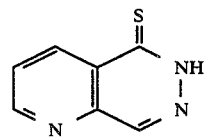

13.

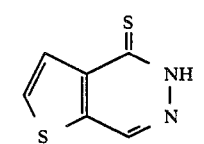

14.

-continued
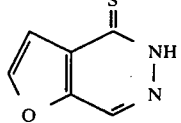 15.
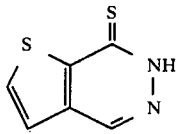 16.
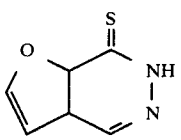 17.
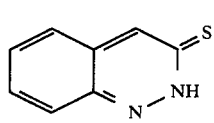 18.
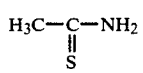 19.
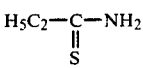 20.
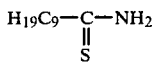 21.
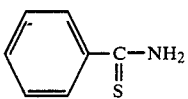 22.
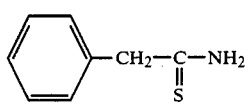 23.
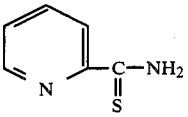 24.
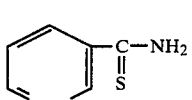 25.
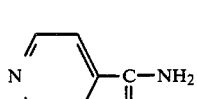 26.
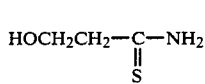 27.
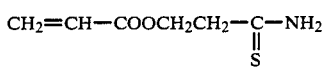 28.
-continued
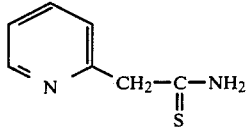 29.
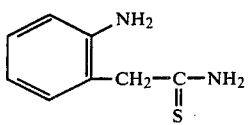 30.
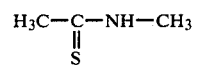 31.
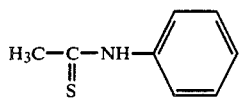 32.
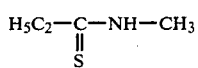 33.
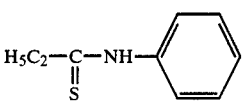 34.
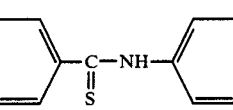 35.
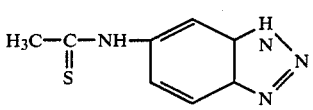 36.
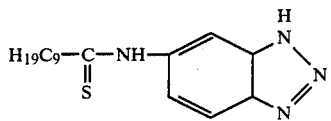 37.
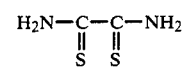 38.
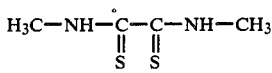 39.
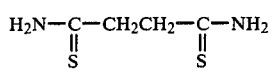 40.
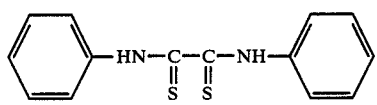 41.
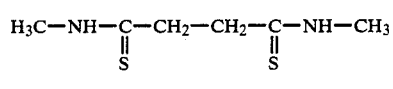 42.
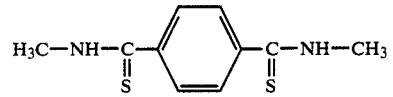 43.

These compounds can be used individually or in combination with one another. They are added in an amount of 0.0005 to 5 wt%, preferably 0.001 to 2 wt%, based on the weight of the photopolymerizable composition.

Preferred ethylenic unsaturated compounds used in this invention have at least two unsaturated groups at terminals and photopolymerize upon exposure to activating light. These compounds are referred to as "functional monomers" hereinafter.

Examples of functional monomers include compounds disclosed in Japanese Patent Publication Nos. 5093/60, 14719/60 and 28727/69.

As a acrylic esters and methacrylic esters, there are polyacrylates and polymethacrylates of polyhydric alcohols: ("Poly(meth)acrylates" as used herein cover dimers, trimers, tetramers, etc., as well as polymers.) The polyhydric alcohols include polyethylene glycol, polypropylene oxide, polybutylene oxide, polycyclohexane oxide, polyethylene oxide, propylene oxide, polystyrene oxide, polyoxetane, polytetrahydrofuran, cyclohexanediol, xylylenediol, di(β-hydroxyethoxy)benzene, glycerin, diglycerin, neopentyl glycol, trimethylolpropane, triethylolpropane, pentaerythritol, dipentaerythritol, sorbitan, sorbitol, butanediol, butanetriol, 2-butene-1,4-diol, 2-n-butyl-2-ethylpropanediol, 2-butine-1,4-diol, 3-chloro-1,2-propanediol, 1,4-cyclohexanedimethanol, 3-cyclohexene-1,1-dimethanol, decalindiol, 2,3-dibromo-2-butene-1,4-diol, 2,2-diethyl-1,3-propanediol, 1,5-dihydroxy-1,2,3,4-tetrahydronaphthalene, 2,5-dimethyl-2,5-hexanediol, 2,2-dimethyl-1,3-propanediol, 2,2-diphenyl-1,3-propanediol, dodecanediol, mesoerythritol, 2-ethyl-1,3-hexanediol, 2-ethyl-2-(hydroxymethyl)-1,3-propanediol, 2-ethyl-2-methyl-1,3-propanediol, heptanediol, hexanediol, 3-hexene-2,5-diol, hydroxybenzyl alcohol, hydroxyethyl resorcinol, 2-methyl-1,4-butanediol, 2-methyl-2,4-pentanediol, nonanediol, octanediol, pentanediol, 1-phenyl-1,2-ethanediol, propanediol, 2,2,4,4-tetramethyl-1,3-cyclobutanediol, 2,3,5,6-tetramethyl-p-xylene-α,α'-diol, 1,1,4,4-tetraphenyl-1,4-butanediol, 1,1,4,4-tetraphenyl-2-butine-1,4-diol, 1,2,6-trihydroxyhexane, 1,1'-bi-2-naphthol, dihydroxynaphthalene, 1,1'-methylene-2-naphthol, 1,2,4-benzenetriol, biphenyl, 2,2'-bis(4-hydroxyphenyl)butane, 1,1-bis(4-hydroxyphenyl)cyclohexane, bis(hydroxyphenyl)methane, catechol, 4-chlororesorcinol, 3,4-dihydroxyhydrocinnamic acid, hydroquinone, hydroxybenzyl alcohol, methylhydroquinone, methyl-2,4,6-trihydroxybenzoate, fluoroglucinol, pyrogallol, resorcinol, glucose, α-(1-aminoethyl)-p-hydroxybenzyl alcohol, 2-amino-2-ethyl-1,3-propanediol, 2-amino-2-methyl-1,3-propanediol, 3-amino-1,2-propanediol, N-(3-aminopropyl)diethanolamine, N,N'-bis(2-hydroxyethyl)piperazine, 2,2-bis(hydroxymethyl)-2,2',2"-nitrilotriethanol, 2,2-bis(hydroxymethyl)propionic acid, 1,3-bis(hydroxymethyl)urea, 1,2-bis(4-pyridyl)-1,2-ethanediol, N-n-butyldiethanolamine, diethanolamine, N-ethylenediethanolamine, 3-mercapto-1,2-propanediol, 3-piperazino-1,2-propanediol, 2-(2-pyridyl)-1,3-propanediol, triethanolamine, α-(1-aminoethyl)-p-hydroxybenzyl alcohol and 3-amino-4-hydroxyphenyl sulfone. Preferable from the standpoint of availability among these acrylic esters and methacrylic esters are ethylene glycol diacrylate, diethylene glycol dimethacrylate, polyethylene glycol diacrylate, trimethylolpropane triacrylate, trimethylolpropane trimethacrylate, pentaerythritol triacrylate, pentaerythritol tetraacrylate, pentaerythritol dimethacrylate, dipentaerythritol pentaacrylate, glycerin triacrylate, diglycerin dimethacrylate, 1,3-propanediol diacrylate, 1,2,4-butanetriol trimethacrylate, 1,4-cyclohexanediol diacrylate, 1,5-pentanediol diacrylate, neopentyl glycol diacrylate, and triacrylic ester of ethylene oxide adduct of trimethylolpropane.

The acrylamides and methacrylamides include not only methylene bisacrylamide and methylene bismethacrylamide but polyacrylamide and polymethacrylamide both derived from ethylenediamine, diaminopropane, diaminobutane, pentamethylenediamine, hexamethylene-bis(2-aminopropyl)amine, diethylenetriamine, heptamethylenediamine, octamethylenediamine, polyamines having heterogeneous atoms between two or more amino groups, and polyamines having a ring (e.g., phenylenediamine, xylylenediamine, β-(4-aminophenyl)ethylamine, diaminobenzoic acid, diaminotoluene, diaminoanthraquinone, and diaminofluorene).

The allyl compounds include diallyl esters of dicarboxylic acids such as phthalic acid, terephthalic acid, sebacic acid, adipic acid, glutaric acid, malonic acid, and oxalic acid. Examples of such allyl esters include diallyl esters and diallyl amides of disulfonic acids such as anthraquinone disulfonic acid, benzene disulfonic acid, 2,5-dihydroxy-p-benzenedisulfonic acid, dihydroxynaphthalene disulfonic acid, and naphthalenedisulfonic acid.

The vinyl ether compounds include polyvinyl ethers of the above-mentioned polyhydric alcohol, e.g., ethylene glycol divinylether, 1,3,5-tri-β-vinyloxyethoxybenzene, 1,3-di-β-vinyloxyethoxybenzene, and glycerol trivinyl ether.

The vinyl esters include divinyl succinate, divinyl adipate, divinyl phthalate, divinyl terephthalate, divinyl benzene-1,3-disulfonate, and divinylbutane-1,4-disulfonate.

Styrene compounds include divinyl benzene, p-allylstyrene, and p-isopropenestyrene.

Those compounds which have two or more different kinds of unsaturated bonds which undergo addition polymerization can be suitably used in this invention. Examples of such compounds include N-β-hydroxyethyl-β-(methacrylamide)ethylacrylate, N,N-bis(β-methacryloxyethyl)acrylamide, and allyl methacrylate.

Other compounds which can be suitably used in this invention include polyfunctional urethane compounds having at least two ethylenic unsaturated groups. Such compounds are obtained by reacting a reaction product of a polyol compound having at least two hydroxyl groups and a polyisocyanate compound having at least two isocyanate groups in a slight excess, with a compound having at least one hydroxyl group and at least one ethylenic unsaturated group.

These polyfunctional monomers may be used individually or in combination with one another. They are used in an amount of 10 to 500 parts by weight, and preferably 30 to 200 parts by weight, per 100 parts by weight of the binder polymer compound.

The binder used in the photopolymerizable compound of this invention is selected from a large variety of synthetic, semisynthetic and natural polymeric substances which meet the following conditions. The miscibility with the polyfunctional monomer, photopolymerization initiator, and the thiohydrazide compound or the carbothio acid amide compound is good to such an extent that the binder does not separate from a coating solution containing the above-described components in the production processes from the preparation of the solution to the application of the solution and subsequent drying. The binder should have proper strength, stretchability, abrasion resistance, chemical resistance, molecular weight, hardness, softening point, crystallinity, and elongation at break. Examples of the binder include chlorinated polyolefins such as chlorinated polyethylene and chlorinated polypropylene; polyacrylic alkyl esters and polymethacrylic alkyl esters (the alkyl group may be a methyl group, an ethyl group, a butyl group, etc.) such as polymethyl methacrylate; copolymers of acrylic acid or methacrylic acid with acrylic alkyl ester or methacrylic alkyl ester (the alkyl group is the same as above); polyacrylic acid; polymethacrylic acid; copolymers of acrylic alkyl ester or methacrylic alkyl ester (the alkyl group is the same as above) with at least one monomer of acrylonitrile, vinyl chloride, vinylidene chloride, styrene, and butadiene; polyvinyl chloride; copolymers of vinyl chloride and acrylonitrile; polyvinylidene chloride; copolymers of vinylidene chloride and acrylonitrile; copolymers of vinyl acetate and vinyl chloride; polyacrylonitrile; copolymers of acrylonitrile and styrene; copolymers of acrylonitrile, butadiene, and styrene; copolymers of styrene and unsaturated dibasic acid anhydride such as maleic anhydride; polyvinyl butyral; styrene butadiene rubber; chlorinated rubber; cyclized rubber; and acetyl cellulose. The copolymers should preferably contain more than 5 mol% of comonomer. Any other polymers than above may be used as the binder so long as they meet the above-mentioned conditions.

Preferable among the above-mentioned binder polymers are chlorinated polyethylene, chlorinated polypropylene, polymethyl methacrylate, methacrylic acid-methyl methacrylate copolymer (containing 5 to 50 mol% of methacrylic acid), methyl methacrylate-acrylonitrile copolymer (containing 20 to 80 mol% of methyl methacrylate), vinyl chloride-acrylonitrile copolymer (containing 20 to 80 mol% of vinyl chloride), vinylidene chloride-acrylonitrile copolymer (containing 20 to 80 mol% of vinylidene chloride), and styrene-maleic anhydride copolymer (containing 40 to 60 mol% of styrene).

These polymers may be used individually or in combination with one another so long as they are properly miscible with one another.

The polymer used as the binder should have a molecular weight of 5,000 to 2,000,000, and preferably 50,000 to 1,000,000.

The photopolymerization initiator used in this invention includes the known carbonyl compounds, organic sulfur compounds, peroxides, redox compounds, azo and diazo compounds, halogen compounds, and photoreducing dyes as described in Chapter 5 of *Light-Sensitive Systems* written by J. Causer.

Examples of carbonyl compounds include benzoin, benzoin methyl ether, benzophenone, Michler's ketone, 4,4-bis(diethylamino)benzophenone, anthraquinone, 2-t-butylanthraquinone, 3-chlorobenzanthrone, diacetyl, 2-benzoylmethylene-3-methyl-β-naphthothiazoline, and 5-chloro-3-ethyl-2-p-methoxybenzoyl methylenebenzothiazoline.

Examples of organic sulfur compounds include di-n-butyldisulfide, dibenzyldisulfide, 2-mercaptobenzothiazole, 2-mercaptobenzimidazole, thiophenol and ethyltrichloromethanesulfonate.

Examples of peroxides include di-t-butyl peroxide, benzoyl peroxide and methyl ethyl ketone peroxide.

The redox compound is composed of a peroxide and a reducing agent. Examples of redox compounds include one composed of ferrous ions and persulfate ions and one composed of ferric ions and peroxide.

Examples of azo and diazo compounds include α,α'-azobisisobutyronitrile, 2-azobis-2-methylbutyronitrile, and diazonium salt of p-aminodiphenylamine.

Examples of halogen compounds include chloromethyl naphthyl chloride, phenacyl chloride, chloroacetone, naphthalene sulfonyl chloride, phenyltribromomethyl sulfone, and tris(trichloromethyl)-s-triazine.

Examples of photoreducing dyes include rose bengal, erythrosine, eosine, acriflavine, riboflavin, and thionine.

These photopolymerization initiators may be used individually or in combination with one another. They are used in an amount of 0.1 to 20 parts by weight, and preferably 0.5 to 10 parts by weight, per 100 parts by weight of the polyfunctional monomer.

The photopolymerizable composition of this invention should preferably be incorporated with a heat polymerization inhibitor such as p-methoxyphenol, hydroquinone, alkyl- or aryl-substituted hydroquinone such as methyl-, ethyl-, propyl-, isopropyl-, t-butyl-, phenyl- and tolyl-substituted hydroquinone, t-butylcatechol, pyrogallol, cuprous chloride, chloranil, naphthylamine, β-naphthol, 2,6-di-t-butyl-p-cresol, pyridine, nitrobenzene, dinitrobenzene, p-toluidine, methylene blue, organic copper, and methyl salicylate. These inhibitors should be added in an amount of 0.001 to 5 parts by weight per 100 parts by weight of the polyfunctional monomer.

The photopolymerizable composition of this invention may be incorporated with a plasticizer to properly control the film properties. Examples of plasticizers include phthalic esters such as dimethyl phthalate, diethyl phthalate, dibutyl phthalate, diisobutyl phthalate, dioctyl phthalate, octylcapryl phthalate, dicyclohexyl phthalate, ditridecyl phthalate, butyl benzyl phthalate, diisodecyl phthalate and diaryl phthalate; glycol esters such as dimethyl glycol phthalate, ethylphthalyl ethylglycolate, methyl phthalyl ethylglycolate, butylphthalyl butylglycolate and triethylene glycol dicaprylic ester; phosphoric esters such as tricresyl phosphate and triphenyl phosphate; esters of dibasic fatty acids such as diisobutyl adipate, dioctyl adipate, dimethyl sebacate, dibutyl sebacate, dioctyl sebacate and dibutyl maleate; amides such as benzenesulfonamide, p-toluenesulfonamide and N-n-butylacetamide; and triethyl citrate, glycerin triacetyl ester and butyl laurate.

When in use as an image forming material, the photopolymerizable composition of this invention is dissolved or dispersed in a solvent, and the resulting solution is applied to a support by a proper method, the applied solution is dried, and, if necessary, the dried film is covered with a protective film.

The solvent includes, for example ketones such as acetone, methyl ethyl ketone, methyl isobutyl ketone, cyclohexanone and diisobutyl ketone; esters such as ethyl acetate, butyl acetate, n-amyl acetate, methyl formate, ethyl propionate, dimethyl phthalate and ethyl benzoate; aromatic hydrocarbons such as toluene, xylene, benzene and ethylbenzene; halogenated hydrocarbons such as carbon tetrachloride, trichloroethylene, chloroform, 1,1,1-trichloroethane, methylene chloride and monochlorobenzene; ethers such as tetrahydrofuran, diethyl ether, ethylene glycol monomethyl ether and ethylene glycol monoethyl ether; and dimethylformamide and dimethyl sulfoxide.

The above-mentioned support should be transparent to light and have a uniform surface. The support is comprised of plastic films comprised of polyethylene terephthalate, polypropylene, polyethylene, cellulose triacetate, cellulose diacetate, polyalkyl acrylate (the alkyl group is a methyl group, an ethyl group, a butyl group, etc. hereinafter the same), polyalkyl methacrylate, alkyl acrylate copolymer and alkyl methacrylate copolymer, polyvinyl chloride, polyvinyl alcohol, polycarbonate, polystyrene, cellophane, polyvinylidene chloride copolymer, polyamide, polyimide, vinyl chloride-vinyl acetate copolymer, polytetrafluoroethylene, polytrifluoroethylene, and others. The support may be made of a composite material thereof. The support is 5 to 150 μm thick, and preferably 10 to 50 μm thick.

The photopolymerizable composition is formed on the support in a dry thickness of 5 to 100 μm, and preferably 10 to 80 μm, depending on the required performance of the image.

The photopolymerizable composition of this invention is applied to the support, and, as occasion demands, the layer of the photopolymerizable composition may be covered with a protective film. Such a protective film may be selected from the above-mentioned plastic films used for the support, paper, and polyethylene- or polypropylene-laminated paper. The protective film should be 5 to 100 μm thick, and preferably 10 to 50 μm thick. The bond strength between the photopolymerizable composition layer and the support should be greater than that between the photopolymerizable composition layer and the protective layer. Examples of the combination of the support and protective film include polyethylene terephthalate/polypropylene, polyethylene terephthalate/polyethylene, polyamide (nylon 6)/polyethylene, polyvinyl chloride/cellophane, and polyimide/polypropylene.

The proper bond strength is obtained by selecting the support and protective film which are different kinds of compounds from each other as mentioned above, or by surface-treating at least either of the support or the protective film. The surface treatment of the support is carried out to increase the bond strength between the support and the photopolymerizable composition layer. Examples of the surface treatment include undercoating, corona discharge treatment, flame treatment, UV irradiation, high-frequency irradiation, glow discharge treatment, active plasma treatment and laser irradiation.

The surface treatment of the protective film is usually carried out to lower the bond strength between the photopolymerizable layer and the protective film. Examples of such surface treatment include undercoating with polyorganosiloxane, fluorinated polyolefin, or polyfluoroethylene. The undercoating is usually dried at 30° to 150° C., preferably 50° to 120° C., for 1 to 30 minutes.

When the image forming material is covered with a protective film, the protective film is peeled off so that the photopolymerizable layer is exposed, before the image forming material is laminated under pressure onto a clean base surface.

A variety of bases are used according to the object for which this invention is intended. Examples of the bases include plastic film, paper, wood, metal plate, and glass plate. When this invention is used as a resist to make printed circuits, the base is a printed circuit board base which is a plastic plate laminated with a thin metal (copper, aluminum, silver, etc.) layer or a plastic film having a thin metal layer formed thereon by plating or vacuum deposition. When the invention is used for making a printing plate, the base is an aluminum plate or a plastic film having an aluminum layer formed thereon. In such a case, the aluminum surface should preferably be silicate-treated or anodized.

The photopolymerizable composition layer should be laminated onto the base at room temperature (15° to 30° C.) or with heating (30° to 180° C.), and preferably at 80° to 140° C.

The photosensitive layer laminated onto the base is exposed through the transparent support to light passing through a mask. Examples of useful light sources include a high-pressure mercury vapor lamp, xenon lamp, carbon arc lamp, halogen lamp, or fluorescent lamp, which radiates electromagnetic waves which pass through the transparent support and activate the photopolymerization initiator. The wavelength ranges from 310 to 700 nm, and preferably 350 to 500 nm, or ultraviolet rays to visible rays. The exposure may also be accomplished by using laser, electron rays, or X-rays.

After the exposure of a desired pattern, the unexposed parts are dissolved by a developing solution such as an organic solvent, aqueous alkaline solution, or aqueous alkaline solution containing an organic solvent. Thus, there is obtained a photocured image on the base.

After the image formation, the base undergoes a subsequent treatment, if necessary. For example, in the production of printed circuit boards, the base undergoes etching with an etching solution of copper chloride or ferric chloride so that the exposed metal is removed, or the base undergoes plating with a plating solution of copper pyrophosphate or copper sulfate so that the exposed metal is plated.

The photopolymerizable resin composition of this invention is suitably used for the production of printed circuit boards. It is also used for the production of lithographic plates, letterpress plates, reliefs, optical duplicates and photography.

The invention is described in more detail with reference to the following non-limiting examples. "Percent" in the examples means "percent by weight".

EXAMPLE 1

Photopolymerizable compositions of the following formulation were prepared. The identification and quantity of the thiohydrazide compound are shown in Table 1. The resulting composition was dissolved in 45 g of methyl ethyl ketone to prepare an application solution.

| | |
|---|---|
| Polymethyl methacrylate [average molecular weight (weight-average): 140,000] | 15.0 g |
| Tetraethylene glycol diacrylate | 6.1 g |
| Trimethylolpropane triacrylate | 2.4 g |
| p-Toluenesulfonamide | 1.62 g |
| p-Methoxyphenol | 0.01 g |
| Malachite green | 0.015 g |
| 4,4'-Bis(diethylamino)benzophenone | 0.04 g |
| Benzophenone | 0.15 g |
| Phenyltribromomethylsulfone | 0.37 g |
| Thiohydrazide compound | See Table 1 |

The application solution was applied to a 25 μm thick polyethylene terephthalate support, followed by drying at 100° C. for 2 minutes. There was obtained an approximately 50 μm thick coating film. The resulting photosensitive material was laminated onto a cleaned copper-clad laminate board (base) at 120° C. Then, the photosensitive material was exposed for 10 seconds to light radiated from a 2 kw high-pressure mercury vapor lamp (Jet Light produced by Oak Co., Ltd.) placed 50 cm away. The temporary support was stripped off from the exposed photosensitive material.

The adhesion of the cured film to the base was evaluated by the crosscut test. (Eleven parallel scratches, 1 mm apart, were made through the film, and then second eleven parallel scratches, 1 mm apart, were made at right angles to the first scratches. Polyester pressure-sensitive tape was pressed down over the cross-cut area and jerked away. The number of small squares remaining is a measure of adhesion.) The results are shown in Table 1.

It is noted from Table 1 that each of the thiohydrazide compounds remarkably increases the adhesion.

TABLE 1

| Thiohydrazide Compound | Quantity Added (mg) | Crosscut Test (%) | Remarks |
| --- | --- | --- | --- |
| — | — | 20 | Comparison |
| Compound 1 | 6.6 | 90 | The present invention |
| Compound 3 | 11.1 | 95 | The present invention |
| Compound 6 | 16.7 | 97 | The present invention |
| Compound 7 | 17.7 | 96 | The present invention |
| Compound 9 | 8.2 | 95 | The present invention |
| Compound 11 | 11.9 | 100 | The present invention |
| Compound 12 | 17.4 | 100 | The present invention |
| Compound 13 | 11.9 | 98 | The present invention |
| Compound 14 | 12.3 | 99 | The present invention |
| Compound 15 | 11.1 | 95 | The present invention |
| Compound 16 | 12.3 | 97 | The present invention |
| Compound 18 | 11.9 | 100 | The present invention |

EXAMPLE 2

Example 1 was repeated except that the thiohydrazide compounds were replaced by the carbothio acid amide compounds as shown in Table 2. The results are also shown in Table 2.

It is noted from Table 2 that each of the carbothio acid amide compounds remarkably increases the adhesion.

TABLE 2

| Carbothio Acid Amide Compound | Quantity Added (mg) | Crosscut Test (%) | Remarks |
| --- | --- | --- | --- |
| — | — | 20 | Comparison |
| Compound 19 | 5.5 | 95 | The present invention |
| Compound 20 | 6.5 | 90 | The present invention |
| Compound 22 | 10.0 | 99 | The present invention |
| Compound 27 | 7.7 | 92 | The present invention |
| Compound 28 | 11.6 | 100 | The present invention |
| Compound 31 | 6.5 | 97 | The present invention |
| Compound 32 | 11.0 | 98 | The present invention |
| Compound 35 | 15.5 | 95 | The present invention |
| Compound 36 | 14.0 | 100 | The present invention |
| Compound 38 | 8.8 | 100 | The present invention |
| Compound 39 | 10.8 | 100 | The present invention |

EXAMPLE 3

The photosensitive material was obtained in the same way as in Example 1. It was laminated at 120° C. onto both sides of a cleaned copper-clad (both sides) laminate board (base) having 500 through-holes, 1.5 mm in diameter. Then, the photosensitive material was exposed for 10 seconds to light radiated from a 2 kw high-pressure mercury vapor lamp (Jet Light produced by Oak Co., Ltd.) placed 50 cm away, with a wiring pattern mask in close contact with the temporary support. The mask has 0.3 to 2.0 mm wide wiring patterns and also has circular patterns 2.5 mm in diameter which cover individual through-holes. The temporary support was stripped off from the exposed photosensitive material. The unexposed parts were dissolved by spraying 1,1,1-trichloroethane for 60 seconds, followed by washing with water and drying. Thus, there were obtained images of wiring patterns.

The copper base having resist patterns thereon was subjected to spray etching with 42° Bé ferric chloride aqueous solution at 40° C. The resist film formed on the copper layer did not peel during the etching in all the cases. The resist film was formed on almost all the openings of the through-holes as shown in Table 3. In the ratio of resist film formed on through-holes shown in Table 3, 100% means that the resist film is formed on all of the openings of the through-holes (that is, 500 openings).

The thiohydrazide compound and the quantity added are also shown in Table 3. It is noted from Table 3 that the photosensitive material containing a thiohydrazide compound forms the resist film on the openings of the through-holes at a very high ratio.

TABLE 3

| Thiohydrazide Compound | Quantity Added (mg) | Ratio of Resist Film Formed on Through-Holes (%) | Remarks |
| --- | --- | --- | --- |
| — | — | 30 | Comparison |
| Compound 1 | 6.6 | 96 | The present invention |
| Compound 3 | 11.1 | 98 | The present invention |
| Compound 6 | 16.7 | 99 | The present invention |
| Compound 7 | 17.7 | 98 | The present invention |
| Compound 9 | 8.2 | 97 | The present invention |
| Compound 11 | 11.9 | 100 | The present invention |
| Compound 12 | 17.4 | 100 | The present invention |
| Compound 13 | 11.9 | 99 | The present invention |
| Compound 14 | 12.3 | 100 | The present invention |
| Compound 15 | 11.1 | 98 | The present |

TABLE 3-continued

| Thiohydrazide Compound | Quantity Added (mg) | Ratio of Resist Film Formed on Through-Holes (%) | Remarks |
|---|---|---|---|
| Compound 16 | 12.3 | 99 | The present invention |
| Compound 18 | 11.9 | 100 | The present invention |

EXAMPLE 4

By using the sensitive material obtained in Example 2, an image of a wiring pattern was obtained in the same way as in Example 3. The copper base having the resist pattern thereon was subjected to spray etching with 42° Bé ferric chloride aqueous solution at 40° C. The resist film formed on the copper layer did not peel during the etching in all the cases. The resist film was formed on almost all the openings of the through-holes as shown in Table 4.

TABLE 4

| Carbothio Acid Amide Compound | Quantity Added (mg) | Ratio of Resist Film Formed on Through-Holes (%) | Remarks |
|---|---|---|---|
| — | — | 30 | Comparison |
| Compound 19 | 5.5 | 98 | The present invention |
| Compound 20 | 6.5 | 97 | The present invention |
| Compound 22 | 10.0 | 100 | The present invention |
| Compound 27 | 7.7 | 96 | The present invention |
| Compound 28 | 11.6 | 100 | The present invention |
| Compound 31 | 6.5 | 98 | The present invention |
| Compound 32 | 11.0 | 99 | The present invention |
| Compound 35 | 15.5 | 97 | The present invention |
| Compound 36 | 14.0 | 100 | The present invention |
| Compound 38 | 8.8 | 100 | The present invention |
| Compound 39 | 10.8 | 100 | The present invention |

EXAMPLE 5

The sensitive material was obtained in the same manner as in Example 1 except that 4,4'-bis(diethylamino)-benzophenone, benzophenone and phenyltribromomethylsulfone were replaced by 0.19 g of 3-chlorobenzanthrone and 0.19 g of Michler's ketone. The resulting sensitive material was laminated onto a cleaned copper-clad laminate board at 120° C. Exposure was performed in the same manner as in Example 1. The temporary support was peeled away. An epoxy adhesive was applied to the cured resist surface. A copper-clad board was bonded th the epoxy adhesive. The shear peel strength of the laminated resist layer was measured. The results are shown in Table 5. The identification of thiohydrazide compounds and the quantity added are also shown in Table 5. It is noted from Table 5 that the sensitive material containing a thiohydrazide compound of this invention is high in shear strength.

TABLE 5

| Thiohydrazide Compound | Quantity Added (mg) | Shear Peel Strength (kg/cm$^2$) | Remarks |
|---|---|---|---|
| — | — | 10.5 | Comparison |
| Compound 1 | 6.6 | 32.0 | The present invention |
| Compound 3 | 11.1 | 35.0 | The present invention |
| Compound 6 | 16.7 | 35.5 | The present invention |
| Compound 11 | 11.9 | 37.0 | The present invention |
| Compound 12 | 17.4 | 36.5 | The present invention |

EXAMPLE 6

The sensitive material was obtained in the same manner as in Example 2 except that 4,4'-bis(diethylamino)-benzophenone, benzophenone and phenyltribromomethylsulfone were replaced by 0.19 g of 3-chlorobenzanthrone and 0.19 g of Michler's ketone. The resulting sensitive material was laminated onto a cleaned copper-clad laminate board at 120° C. Exposure was performed in the same manner as in Example 2. The temporary support was peeled away. An epoxy adhesive was applied to the cured resist surface. A copper-clad board was bonded to the epoxy adhesive. The shear peel strength of the laminated resist layer was measured. The results are shown in Table 6. The identification of carbothio acid amide compounds and the quantity added are also shown in Table 6. It is noted from Table 6 that the sensitive material containing a carbothio acid amide compound of this invention is high in shear strength.

TABLE 6

| Carbothio Acid Amide Compound | Quantity Added (mg) | Shear Peel Strength (kg/cm$^2$) | Remarks |
|---|---|---|---|
| — | — | 10.5 | Comparison |
| Compound 19 | 5.5 | 35.0 | The present invention |
| Compound 20 | 6.5 | 33.5 | The present invention |
| Compound 22 | 10.0 | 37.0 | The present invention |
| Compound 36 | 14.0 | 36.5 | The present invention |
| Compound 38 | 8.8 | 37.0 | The present invention |

EXAMPLE 7

The sensitive materials were prepared in the same manner as in Example 1 using the following thiohydrazide compounds.

| | |
|---|---|
| Compound 3 | 11.1 mg |
| Compound 6 | 16.7 mg |
| Compound 11 | 11.9 mg |
| Compound 12 | 17.4 mg |

The resulting sensitive material was laminated onto a copper-clad board. Exposure, development and washing were performed in the same manner as in Example 3. Thus, there was obtained a copper-clad base having a cured resist pattern thereon. The exposed copper was plated with solder by using a borofluoride bath of the following composition.

| | |
|---|---|
| Tin borofluoride Sn(BF$_4$)$_2$ (45% aq. soln.) | 300 g |
| Lead borofluoride Pb(BF$_4$)$_2$ (45% aq. soln.) | 100 g |
| Borofluoric acid HBF$_4$ (42% aq. soln.) | 200 g |
| Boric acid H$_3$BO$_3$ | 28 g |
| Water q.s. to | 1 l |

Plating Conditions

Anode: solder rod (tin/lead=6:4)
Bath temperature: 30° C.
Current density of cathode: 3.0 A/dm$^2$
Time: 30 minutes Plating was successfully performed without peeling of resist pattern or the occurrence of pinholes. The resist was easily removed by spraying methylene chloride thereon. The exposed copper was etched by a 20% aqueous solution of ammonium persulfate. Thus, there was obtained a clear wiring pattern.

EXAMPLE 8

The sensitive materials were prepared in the same manner as in Example 1 using the following carbothio acid amide compounds.

| | | |
|---|---|---|
| Compound 19 | thioacetamide | 5.5 mg |
| Compound 22 | thiobenzamide | 10.0 mg |
| Compound 32 | thioacetanilide | 11.0 mg |
| Compound 38 | dithiooxamide | 8.8 mg |

The resulting sensitive material was laminated onto a copper-clad board in the same manner as in Example 1. Exposure, development and washing were performed in the same manner as in Example 3. Thus, there was obtained a copper-clad base having a cured resist pattern thereon. The exposed copper was plated with solder in the same manner as in Example 7. Plating was successfully performed without peeling of the resist pattern or the occurrence of pinholes. The resist was easily removed by spraying methylene chloride thereon. The exposed copper was etched by a 20% aqueous solution of ammonium persulfate. Thus, there was obtained a clear wiring pattern.

EXAMPLE 9

The sensitive materials were prepared in the same manner as in Example 1. Compound 6 and Compound 11 were used as the thiohydrazide compound. For comparison, the sensitive material was prepared in which the thiohydrazide was replaced by tetramethylthiuramdisulfide and diphenylthiocarbazone. The resulting sensitive material was laminated onto a cleaned copper plate in the same manner as in Example 1. The same crosscut test as in Example 1 was carried out.

On the other hand, the sensitive material was exposed in the same manner as in Example 3, with a step wedge (a density increase of 0.15 (Δ log E) at each step) in close contact with the temporary support. After development, washing and drying, there was obtained a negative image corresponding to the wedge. The sensitivity of the sensitive material was evaluated by the step of density at which the image was completely dissolved. The sensitivity of the sensitive material containing Compound 6 was regarded as 100, and the sensitivity of the other sensitive materials was comparatively determined. The results are shown in Table 7.

TABLE 7

| Compound Used | Quantity Added (mg) | Crosscut Test (%) | Comparative Sensitivity | Remarks |
|---|---|---|---|---|
| Compound 6 | 16.7 | 97 | 100 | The present invention |
| Compound 11 | 11.9 | 100 | 100 | The present invention |
| Tetramethyl-thiuramdisulfide | 18.7 | 90 | 40 | Comparison |
| Diphenylthio-carbazone | 17.5 | 95 | 30 | Comparison |

It is noted from Table 7 that the thiohydrazide compounds of the present invention remarkably increase the sensitivity are compared with the other compounds.

EXAMPLE 10

The sensitive materials were prepared in the same manner as in Example 1. Compound 19 and Compound 22 were used as the carbothio acid amide compound. For comparison, the sensitive material was prepared in which the carbothio acid amide compound was replaced by tetramethylthiuramdisulfide and diphenylcarbazone. The resulting sensitive material was laminated onto a cleaned copper plate in the same manner as in Example 1. The same crosscut test as in Example 1 was carried out.

On the other hand, the sensitive material was exposed in the same manner as in Example 3, with a step wedge (a density increase of 0.15 (Δ log E) at each step) in close contact with the temporary support. After development, washing and drying, there was obtained a negative image corresponding to the wedge. The sensitivity of the sensitive material was evaluated by the step of the wedge at which the image was completely dissolved. The sensitivity of the sensitive material containing Compound 19 was regarded as 100, and the sensitivity of the other sensitive materials was comparatively determined. The results are shown in Table 8.

TABLE 8

| Compound Used | Quantity Added (mg) | Crosscut Test (%) | Comparative Sensitivity | Remarks |
|---|---|---|---|---|
| Compound 19 | 5.5 | 95 | 100 | The present invention |
| Compound 22 | 10.0 | 99 | 100 | The present invention |
| Tetramethyl-thiuramdisulfide | 18.7 | 90 | 40 | Comparison |
| Diphenylthio-carbazone | 17.5 | 95 | 30 | Comparison |

It is noted from Table 8 that the carbothio acid amide compounds of the present invention remarkably increase the sensitivity as compared with the other compounds.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition which comprises (1) a non-gaseous ethylenic unsaturated compound which has at least two ethylenic unsaturated groups and forms a polymer by the aid of a photopolymerization initiator, (2) a thermoplastic organic polymer binder, (3) a photopolymerization initiator which is activated by activating light, and (4) an adhesion improving additive with respect to a metal surface, the adhesion improving additive being a derivative of a thiohydrazide as represented by formula (I) or at least one derivative of a carbothio acid amide as represented by formula (II) or formula (III):

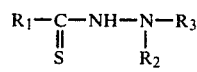  (I)

wherein $R_1$, $R_2$ and $R_3$ each represents a hydrogen atom, an alkyl group, an aryl group, a heterocyclic group, an acyl group, or an aralkyl group; and they may be the same or different from one another and they may form a ring

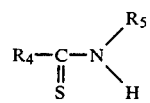  (II)

wherein $R_4$ and $R_5$ each represents a hydrogen atom, an alkyl group, an aryl group, a heterocyclic group, or an aralkyl group; and they may be the same or different from each other,

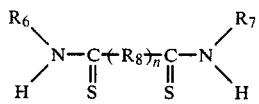  (III)

wherein $R_6$ and $R_7$ each represents the same group as defined for $R_4$ and $R_5$; $R_8$ represents an alkylene group, an arylene group or a heteroarylene group; and n denotes 0 or 1, and wherein the amount of ingredient (1) is 10 to 500 parts by weight per 100 parts by weight of ingredient (2), the amount of ingredient (3) is 0.1 to 20 parts by weight per 100 parts by weight of ingredient (1), and the amount of ingredient (4) is 0.0005 to 5% by weight based on the weight of the photopolymerizable composition.

2. A photopolymerizable composition of claim 1, wherein a heat polymerization inhibitor is included in an amount of 0.001 to 5 parts by weight per 100 parts by weight of ingredient (1).

3. A photopolymerizable composition as claimed in claim 1, wherein the amount of ingredient (4) is 0.01 to 2 wt% based on the weight of the photopolymerizable composition.

4. A photopolymerizable composition as claimed in claim 1, wherein the thermoplastic organic polymer binder is a chlorinated polyolefin, a polyacrylic alkyl ester, a polymethacrylic alkyl ester, a copolymer of acrylic acid or methacrylic acid with acrylic alkyl ester or methacrylic alkyl ester, polyacrylic acid, polymethacrylic acid, a copolymer of acrylic alkyl ester or methacrylic alkyl ester with at least one monomer of acrylonitrile, vinyl chloride, vinylidene chloride, styrene and butadiene, polyvinyl chloride, a copolymer of vinyl chloride and acrylonitrile, polyvinylidene chloride, a copolymer of vinylidene chloride and acrylonitrile, a copolymer of vinyl acetate and vinyl chloride, polyacrylonitrile, a copolymer of acrylonitrile and styrene, a copolymer of acrylonitrile, butadiene and styrene, a copolymer of styrene and an unsaturated dibasic acid anhydride, polyvinyl butyral, styrene butadiene rubber, chlorinated rubber, cyclized rubber, or acetyl cellulose.

5. A photopolymerizable composition as claimed in claim 1, wherein the thermoplastic organic polymer binder is chlorinated polyethylene, chlorinated polypropylene, polymethyl methacrylate, methacrylic acid-methyl methacrylate copolymer containing 5 to 50 mol% of methacrylic acid, methyl methacrylate-acrylonitrile copolymer containing 20 to 80 mol% of methyl methycrylate, vinyl chloride-acrylonitrile copolymer containing 20 to 80 mol% of vinyl chloride, vinylidene chloride-acrylonitrile copolymer containing 20 to 80 mol% of vinylidene chloride or styrene-maleic anhydride copolymer containing 40 to 60 mol% of styrene.

* * * * *